(12) United States Patent
Kao et al.

(10) Patent No.: US 8,253,139 B2
(45) Date of Patent: Aug. 28, 2012

(54) THIN FILM TRANSISTOR SUBSTRATE

(75) Inventors: Yi-Yu Kao, Miao-Li County (TW); Chao-Yi Hung, Miao-Li County (TW); Chien-Ting Lai, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 158 days.

(21) Appl. No.: 12/825,340

(22) Filed: Jun. 29, 2010

(65) Prior Publication Data
US 2011/0031512 A1 Feb. 10, 2011

(30) Foreign Application Priority Data
Aug. 5, 2009 (CN) .......................... 2009 1 0305203

(51) Int. Cl.
*H01L 29/04* (2006.01)
*H01L 29/10* (2006.01)
*H01L 31/00* (2006.01)

(52) U.S. Cl. .............................. 257/59; 257/72; 257/88

(58) Field of Classification Search .................... 257/88, 257/72, 59
See application file for complete search history.

(56) References Cited

U.S. PATENT DOCUMENTS
6,833,900 B2 * 12/2004 Aruga ........................... 349/149
7,595,859 B2 * 9/2009 Park ............................... 349/190
7,952,101 B2 * 5/2011 Yamazaki et al. ............... 257/72
2001/0050747 A1 * 12/2001 Hoshino et al. .............. 349/149

FOREIGN PATENT DOCUMENTS
JP 2003222904 A 8/2003

OTHER PUBLICATIONS
English translation of JP2003-222904.*
* cited by examiner

*Primary Examiner* — Jarrett Stark
*Assistant Examiner* — John M Parker
(74) *Attorney, Agent, or Firm* — Muncy, Geissler, Olds & Lowe, PLLC

(57) ABSTRACT

A thin film transistor substrate, capable of being assembled, is attached to a filter substrate to provide a semi-finished liquid crystal display panel. The thin film transistor substrate includes a base substrate with thin film transistors formed thereon, wiring assemblies formed on the substrate and electrically connected to the corresponding thin film transistors selectively, metal sheets formed on the base substrate, a protection layer formed on the thin film transistors, the wiring assemblies, and the metal sheets, and a buffer module formed on the protection layer. The buffer module is positioned above a projection of a cutting line onto the base substrate, and the surplus materials of the filter substrate are removed along the cutting line.

19 Claims, 7 Drawing Sheets

THIN FILM TRANSISTOR SUBSTRATE

BACKGROUND

1. Technical Field

The present disclosure relates to thin film transistor substrates, and more particularly, to a thin film transistor substrate capable of preventing wiring assembly damage.

2. Description of the Related Art

Referring to FIG. 6, a schematic partial cross-section of a typical semi-finished liquid crystal display panel is shown. Manufacturing of the semi-finished liquid crystal display panel generally includes attaching a filter substrate 11 to a thin film transistor substrate 12; removing a plurality of surplus materials 112 of the filter substrate 11 along a cutting line 111 thereon; packaging a plurality of liquid crystal modules (not shown) between the filter substrate 11 and the thin film transistor substrate 12; and electrically connecting the thin film transistor substrate 12 to a driver integrated circuit (IC) (not shown).

Referring to FIG. 7, a commonly-used thin film transistor substrate 12 includes a base substrate 121, a plurality of thin film transistors 122 positioned on the base substrate 121, a plurality of wiring assemblies 123 electrically connected to corresponding thin film transistors 122 selectively, a plurality of metal sheets 124 formed on the base substrate 121, a plurality of purging areas 125 formed on the base substrate 121, and a protection layer 126. The wiring assemblies 123 may be gate wiring assemblies or data wiring assemblies. The metal sheets 124 may be common voltage wirings. Each purging area 125 is positioned between two adjacent wiring assemblies 123 or between a metal sheet 124 and its adjacent wiring assembly 123.

Referring to FIG. 6 again, the thin film transistor substrate 12 is shown to be attached to the filter substrate 11 to make a semi-finished liquid crystal display panel, the thin film transistor substrate 12 is first positioned relative to the filter substrate 11 and the thin film transistor substrate 12 is adhered to the filter substrate 11; and then the surplus materials 112 are removed on a side of the filter substrate 11 along a cutting line 111. The cutting line 111 defines a connection area whereby the wiring assemblies 123 electrically connect to the driver IC. However, since the protection layer 126 is relatively thin, and the cutting line 111 is generally above the wiring assemblies 123, the wiring assemblies 123 may be damaged directly, or be potentially damaged by the impact of the surplus materials 112 separating from the filter substrate 11, thereby the yield rate is unduly decreased.

Therefore, there is room for improvement within the art.

SUMMARY

The present disclosure provides a thin film transistor substrate capable of being assembled to a filter substrate to provide a semi-finished display crystal panel. The thin film transistor substrate includes a base substrate, a plurality of thin film transistors formed on the base substrate, a plurality of wiring assemblies formed on the base substrate and selectively connected to a plurality of corresponding thin film transistors, a plurality of metal sheets formed on the base substrate, a protection layer formed on the plurality of thin film transistors, the plurality of wiring assemblies, and the plurality of metal sheets, and a buffer module formed on the protection layer. The buffer module is substantially positioned above a projection of a cutting line onto the base substrate. A plurality of surplus materials of the filter substrate can be removed along the cutting line.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views and all the views are schematic.

DETAILED DESCRIPTION

Figure 1:
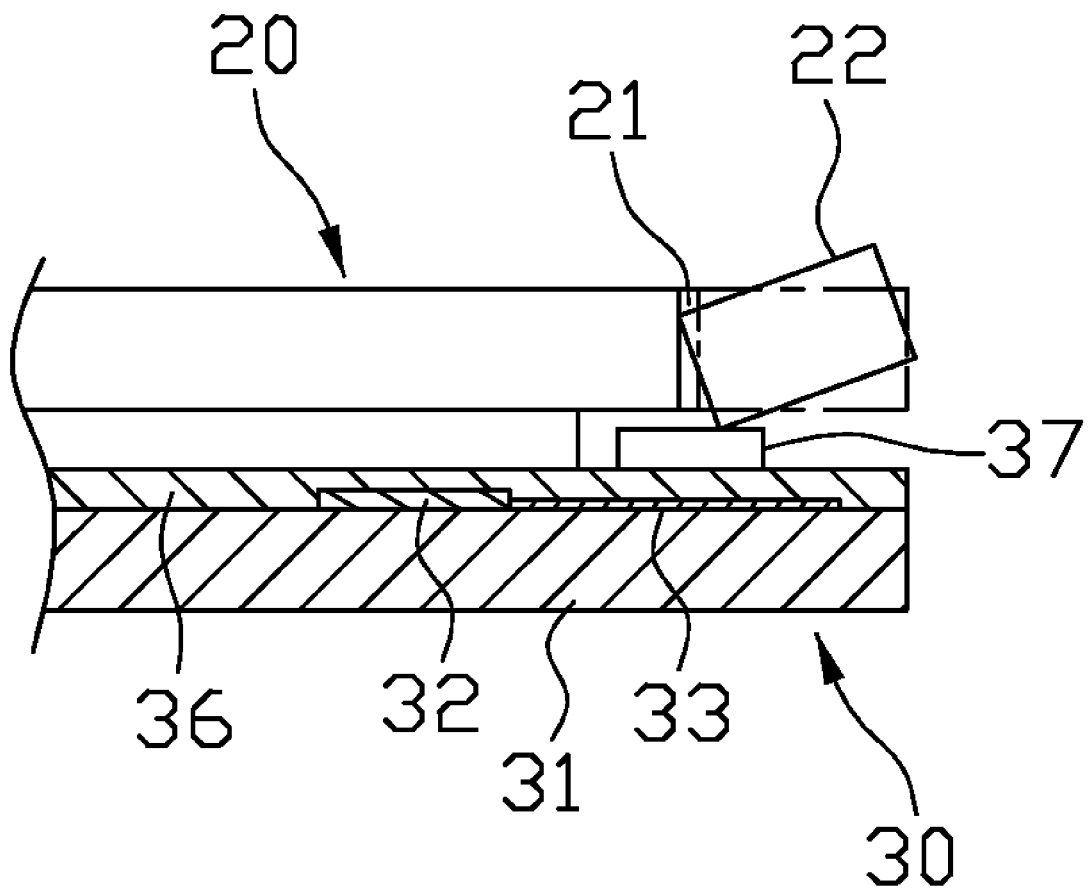
FIG. 1 is a partial cross-section of a semi-finished liquid crystal display panel employing one embodiment of a thin film transistor substrate, as disclosed herein.

Referring to FIG. 1, a thin film transistor substrate 30 according to a first embodiment is capable of being assembled to a filter substrate 20. A semi-finished liquid crystal display panel may be manufactured by removing a plurality of surplus materials 22 from the filter substrate 20 by cutting along a cutting line 21 of the filter substrate 20; the liquid crystal modules (not shown) are packaged between the thin film transistor substrate 30 and the filter substrate 20; and the thin film transistor substrate 30 is electrically connected to a driver IC (not shown).

Figure 2:
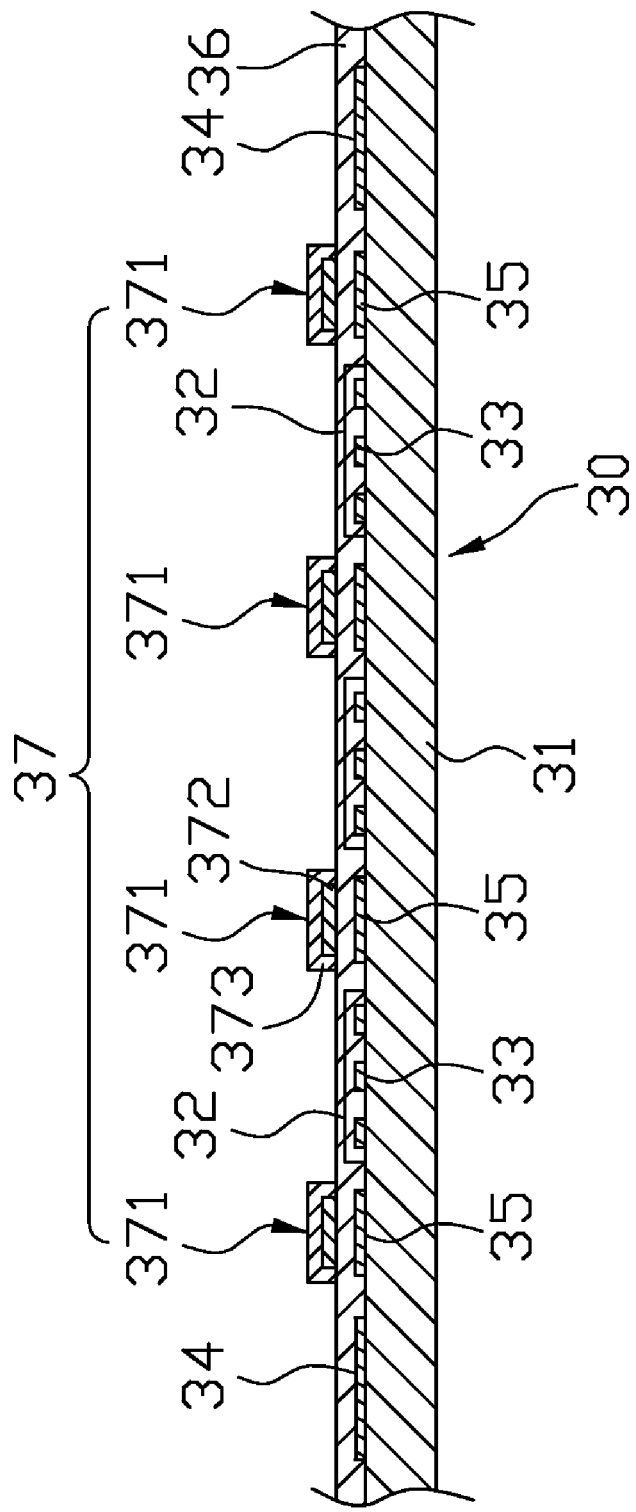
FIG. 2 is a cross-section of a first embodiment of a thin film transistor substrate perpendicular to a cutting line.

Referring to FIG. 2, the thin film transistor substrate 30 includes a base substrate 31, a plurality of thin film transistors 32, a plurality of wiring assemblies 33, a plurality of metal sheets 34, a plurality of purging areas 35, a protection layer 36 and a buffer module 37. The wiring assemblies 33 may be data wiring assemblies or gate wiring assemblies. The metal sheets 34 may be common voltage wirings.

The thin film transistor 32 is formed on the base substrate 31. The wiring assemblies 33 are formed on the base substrate 31 and electrically connect the thin film transistors 32 to the driver IC selectively, such that the thin film transistors 32 can be controlled by the driver IC. The metal sheets 34 are formed on the base substrate 31. A common voltage can be applied to the metal sheets 34. The purging areas 35 are formed on the base substrate 31, each of which is positioned between two adjacent wiring assemblies 33 or between a metal sheet 34 and adjacent wiring assembly 33. The protection layer 36 is formed on the plurality of thin film transistors 32, the plurality of wiring assemblies 33, the plurality of metal sheets 34, and the plurality of purging areas 35. The protection layer 36 is configured to protect the thin film transistors 32, the wiring assemblies 33, the metal sheets 34, and the purging areas 35.

The buffer module 37, which includes a plurality of main buffers 371, is formed on the protection layer 36. Each main buffer 371 is substantially positioned above a projection of the cutting line 21 onto the base substrate 31, and includes a bottom layer 372 and a wrapping layer 373 covering the bottom layer 372. The bottom layer 372 is made of a conductive material, such as Mo, MoNb, MoN, Ti/Al/Ti, Mo/Al/Mo or Mo/AlNd/Mo. The wrapping layer 373 is made of an insulation material, such as SiNx or SiOx. The height of the highest surface of the buffer module 37 exceeds the height of the top surface of any one of the wiring assemblies 33 by at least 0.2 µm.

Referring to FIG. 1 again, in the first exemplary embodiment, the buffer module 37 is above the purging areas 35. During removal of the surplus materials 22 from the filter substrate 20, the physical impact generated by falling surplus materials 22 is absorbed by the buffer module 37, thereby preventing the wiring assembly 33 from damage. Even when the physical impact of the surplus materials 22 exceeds the maximum tolerance of the buffer module 37, the wiring assemblies 33 are still further protected since the impact can be transferred to the purging areas 35 via the buffer module 37 rather than directly impacting the wiring assemblies 33.

In the illustrated embodiment, a center line of the main buffer 371 coincides with the projection of the cutting line 21 on the base substrate 31. The distance between the center line and the edge of the main buffer 371 exceeds about 150 µm, such that the removed surplus materials 22 are dropped onto the buffer module 37, and the wiring assemblies 33 are protected, and thus the yield rate is improved.

Figure 3:
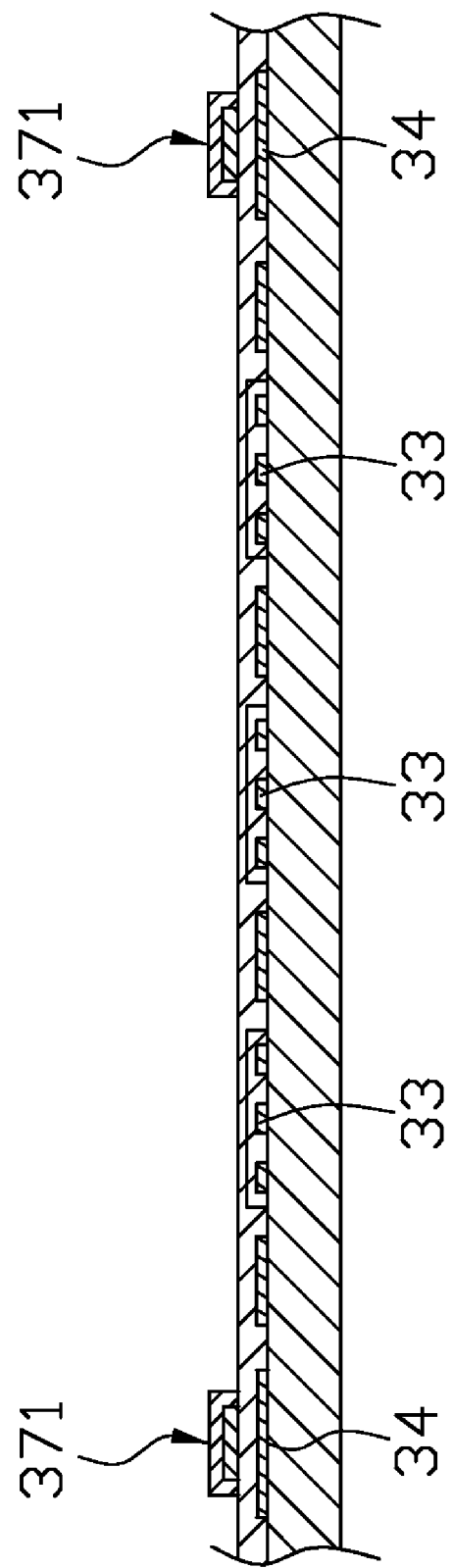
FIG. 3 is a cross-section of a second embodiment of a thin film transistor substrate perpendicular to a cutting line.

Referring to FIG. 3, a second embodiment of the thin film transistor substrate 30 is shown, and differing from the first embodiment only in that the main buffers 371 of the buffer module 37 are positioned above the corresponding metal sheets 34, such that the wiring assemblies 33 are protected from damage when removing the dropped surplus materials 22 from the thin film transistor substrate 30.

Figure 4:
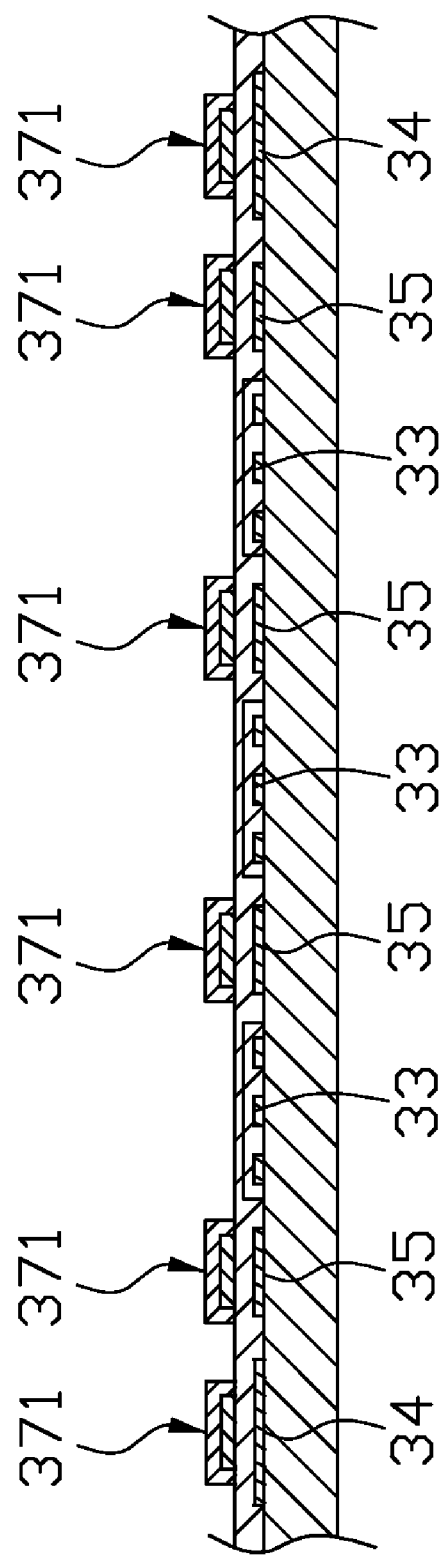
FIG. 4 is a cross-section of a third embodiment of a thin film transistor substrate perpendicular to a cutting line.

Referring to FIG. 4, a third embodiment of the thin film transistor substrate 30 is shown, and differing from the first embodiment only in that the main buffers 371 of the buffer module 37 are positioned above the corresponding metal sheets 34 and the purging areas 35, such that the wiring assemblies 33 are protected from damage when removing the dropped surplus materials 22 from the thin film transistor substrate 30.

Figure 5:
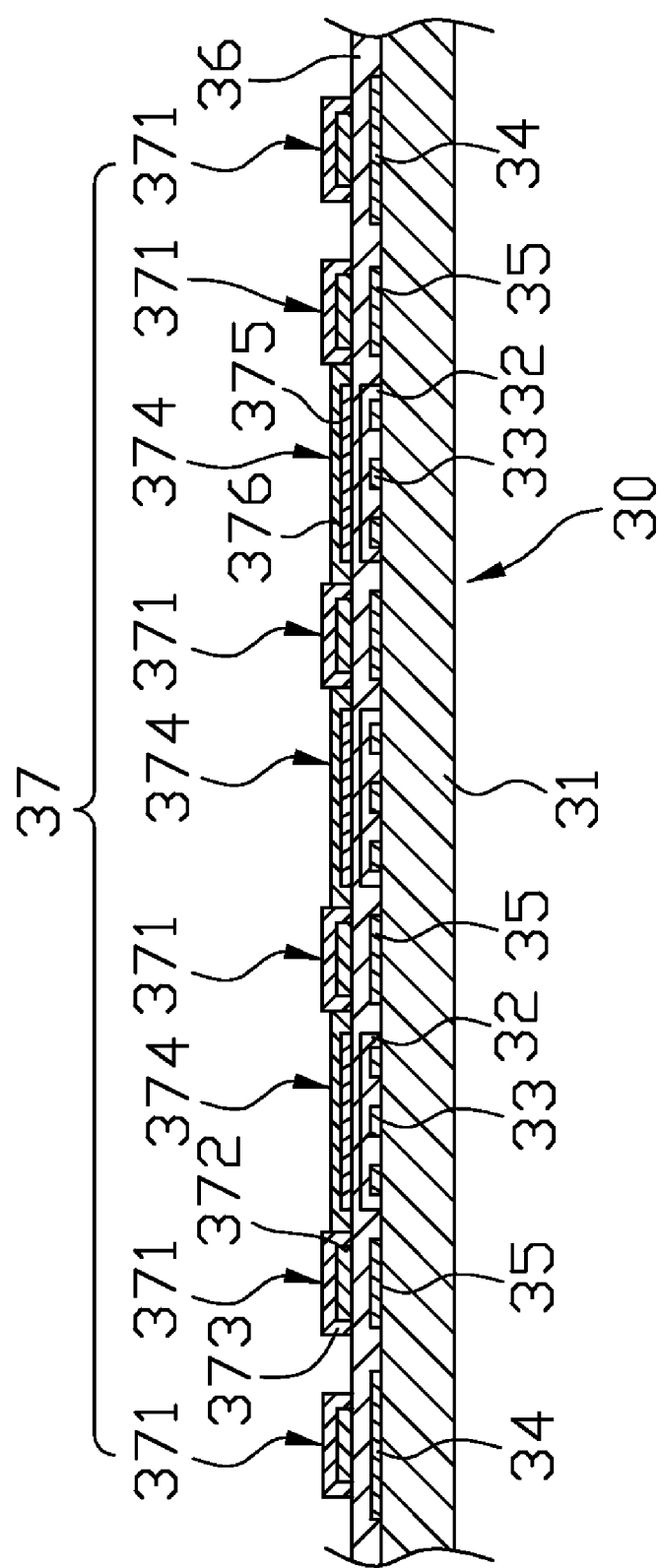
FIG. 5 is a cross-section of a fourth embodiment of a thin film transistor substrate perpendicular to a cutting line.
Figure 6:
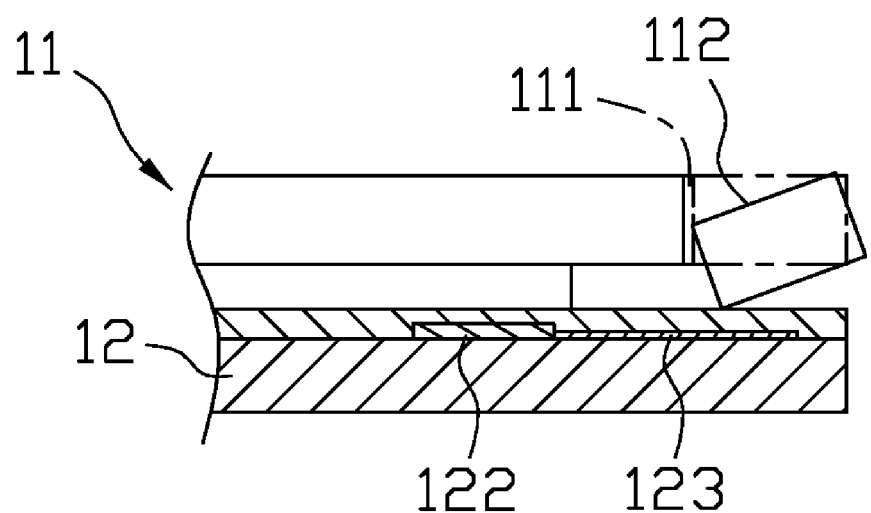
FIG. 6 is a partial cross-section of a semi-finished liquid display panel employing a commonly used thin film transistor substrate.
Figure 7:
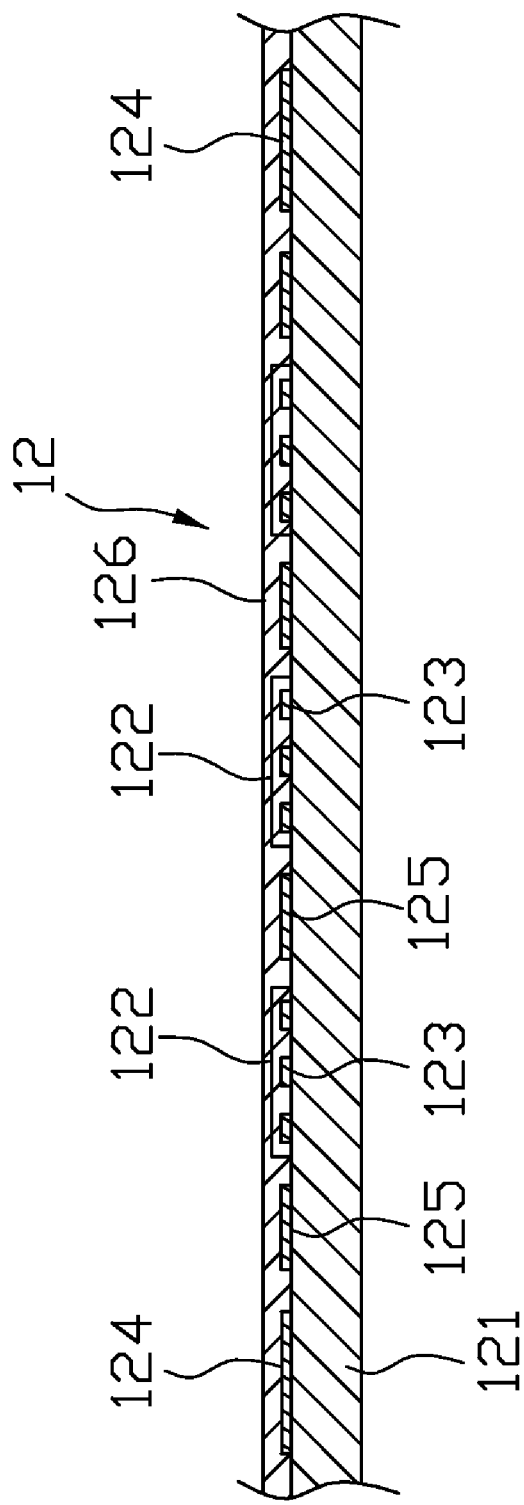
FIG. 7 is a cross-section of the thin film transistor substrate in FIG. 6, perpendicular to a cutting line.

Referring to FIG. 5, a fourth embodiment of the thin film transistor substrate 30 is shown, and differing from the third embodiment only in that the buffer module 37 further includes a plurality of assistant buffers 374 above corresponding wiring assemblies 33, such that the wiring assemblies 33 are protected from damage when removing the dropped surplus materials 22 from the thin film transistor substrate 30.

Each of the assistant buffers 374 includes a bottom layer 375 and a wrapping layer 376 covering the bottom layer 375. The bottom layer 375 is made of a metal conductive material, such as Mo, MoNb, MoN, Ti/Al/Ti, Mo/Al/Mo or Mo/AlNd/Mo. The wrapping layer 376 is made of an insulation material, such as SiNx or SiOx. The height of the highest surface of the assistant buffer 374 is lower than that of the main buffer 371. A center line of the assistant buffer 374 coincides with a projection of the cutting line 21 on the base substrate 31. The distance between the center line and the edge of the assistant buffer 374 exceeds about 150 µm.

The main buffers 371 and assistance buffers 374 are positioned above the corresponding purging areas 35, the metal sheets 34, and the wiring assemblies 33. As the surplus materials 22 are removed and dropped, the physical impact caused thereby can be absorbed by the buffer module 37, thus protecting the wiring assemblies 33. In addition, the assistant buffers 374 provide further protection when removing the surplus materials 22 from the thin film transistor substrate 30, thereby sufficiently protecting the wiring assemblies 33 and improving the yield rate.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A thin film transistor substrate, capable of being assembled to a filter substrate, for a semi-finished display crystal panel, the thin film transistor substrate comprising:
   a base substrate;
   a plurality of thin film transistors formed on the base substrate;
   a plurality of wiring assemblies formed on the base substrate and electrically connected to corresponding thin film transistors selectively;
   a plurality of metal sheets formed on the base substrate;
   a protection layer formed on the plurality of thin film transistors, the plurality of wiring assemblies, and the plurality of metal sheets; and
   a buffer module formed on the protection layer, wherein the buffer module is substantially positioned above a projection of a cutting line onto the base substrate, and a plurality of surplus materials of the filter substrate is removed along the cutting line,
   wherein the buffer module comprises a plurality of main buffers.

2. The thin film transistor substrate of claim 1, wherein the height of the highest surface of the buffer module exceeds the height of a top surface of the wiring assemblies by at least 0.2 µm.

3. The thin film transistor substrate of claim 1, wherein a center line of each main buffer coincides with a projection of the cutting line onto the substrate.

4. The thin film transistor substrate of claim 3, wherein the distance between the center line of the main buffer and an edge of the main buffer exceeds about 150 µm.

5. The thin film transistor substrate of claim 1, wherein each main buffer is positioned above a corresponding metal sheet.

6. The thin film transistor substrate of claim 1, further comprising a plurality of purging areas formed on the base substrate, wherein each purging area is positioned between two adjacent wiring assemblies.

7. The thin film transistor substrate of claim 6, wherein each main buffer is positioned above a corresponding purging area.

8. The thin film transistor substrate of claim 6, wherein the main buffers are positioned above corresponding purging area and metal sheets.

9. The thin film transistor substrate of claim 1, wherein each main buffer comprises a bottom layer and a wrapping layer formed on the bottom layer.

10. The thin film transistor substrate of claim 9, wherein the bottom layer is made of a metal conductive material and the wrapping layer is made of an insulation material.

11. The thin film transistor substrate of claim 10, wherein the metal conductive material is Mo, MoNb, MoN, Ti/Al/Ti, Mo/Al/Mo or Mo/AlNd/M, and the insulation material is SiNx or SiOx.

12. The thin film transistor substrate of claim 1, wherein the buffer module further comprises a plurality of assistant buffers, the height of the assistant buffer is lower than that of the main buffer, and each assistant buffer is positioned above one corresponding wiring assembly.

13. The thin film transistor substrate of claim 12, wherein a center line of each assistant buffer coincides with a projection of the cutting line onto the base substrate.

14. The thin film transistor substrate of claim 13, wherein the distance between the center line of the assistant buffer and an edge of the assistant buffer exceeds about 150 μm.

15. The thin film transistor substrate of claim 12, wherein each assistant buffer comprises a bottom layer and a wrapping layer covering the bottom layer.

16. The thin film transistor substrate of claim 15, wherein the bottom layer is made of a metal conductive material and the wrapping layer is made of an insulation material.

17. The thin film transistor substrate of claim 16, wherein the metal conductive material is Mo, MoNb, MoN, Ti/Al/Ti, Mo/Al/Mo or Mo/AlNd/M, and the insulation material SiNx and SiOx.

18. The thin film transistor substrate of claim 1, further comprising a plurality of purging areas formed on the base substrate, wherein each purging area is positioned between adjacent wiring assemblies and the metal sheets.

19. The thin film transistor substrate of claim 18, wherein each main buffer is positioned above a corresponding purging area.

* * * * *